United States Patent [19]
Quate et al.

[11] 3,935,564
[45] Jan. 27, 1976

[54] CHARGE STORAGE AND MONITORING APPARATUS UTILIZING ACOUSTIC WAVES

[75] Inventors: Calvin F. Quate, Los Altos Hills; Thomas W. Grudkowski, Palo Alto, both of Calif.

[73] Assignee: The Board of Trustees of Leland Stanford, Jr. University, Stanford, Calif.

[22] Filed: Dec. 2, 1974

[21] Appl. No.: 528,742

[52] U.S. Cl. ...... 340/173 R; 307/221 R; 307/221 D; 357/26
[51] Int. Cl.² ................. G11C 13/00; G11C 27/00; G11C 19/00
[58] Field of Search ...... 340/173 R, 173 RC, 173.2; 357/26; 307/221 R, 221 D; 333/30 R

[56] References Cited
UNITED STATES PATENTS

| | | | |
|---|---|---|---|
| 3,816,753 | 6/1974 | Kino | 307/88.3 |
| 3,886,527 | 5/1975 | Bert et al. | 340/173 CR |

*Primary Examiner*—Stuart N. Hecker
*Attorney, Agent, or Firm*—Paul B. Fihe

[57] ABSTRACT

Charge storage and monitoring apparatus including a barrier electrode capable of supporting a charge adjacent a piezoelectric semiconductor to control the depletion layer and provide an output signal related to an acoustic wave in the semiconductor and the applied charge.

21 Claims, 7 Drawing Figures

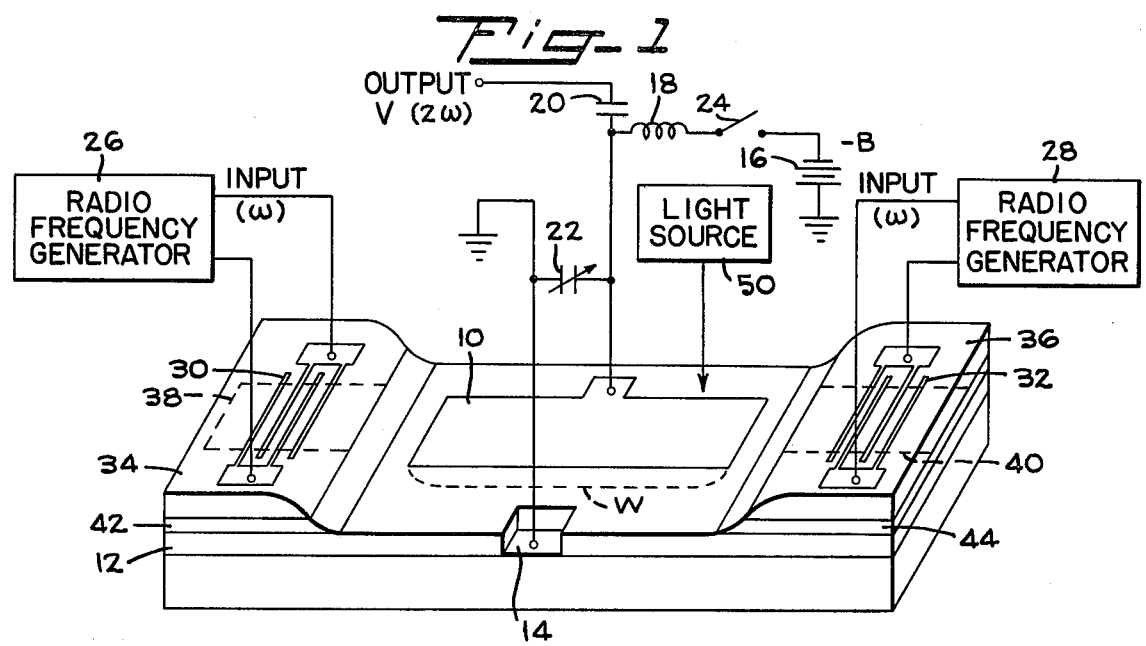
Fig_1
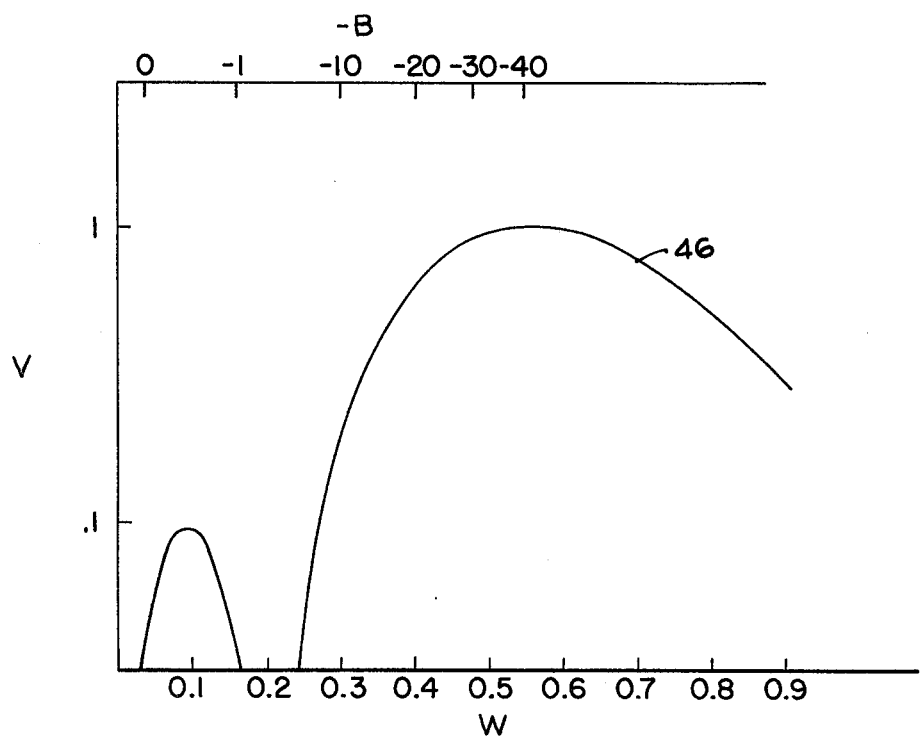
Fig_2

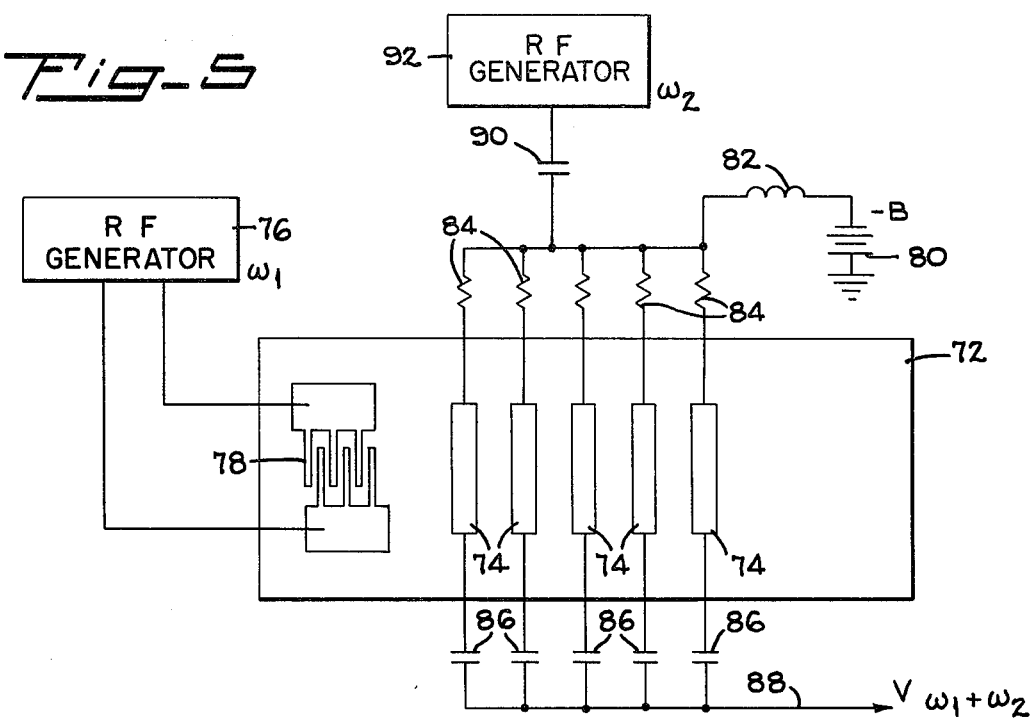
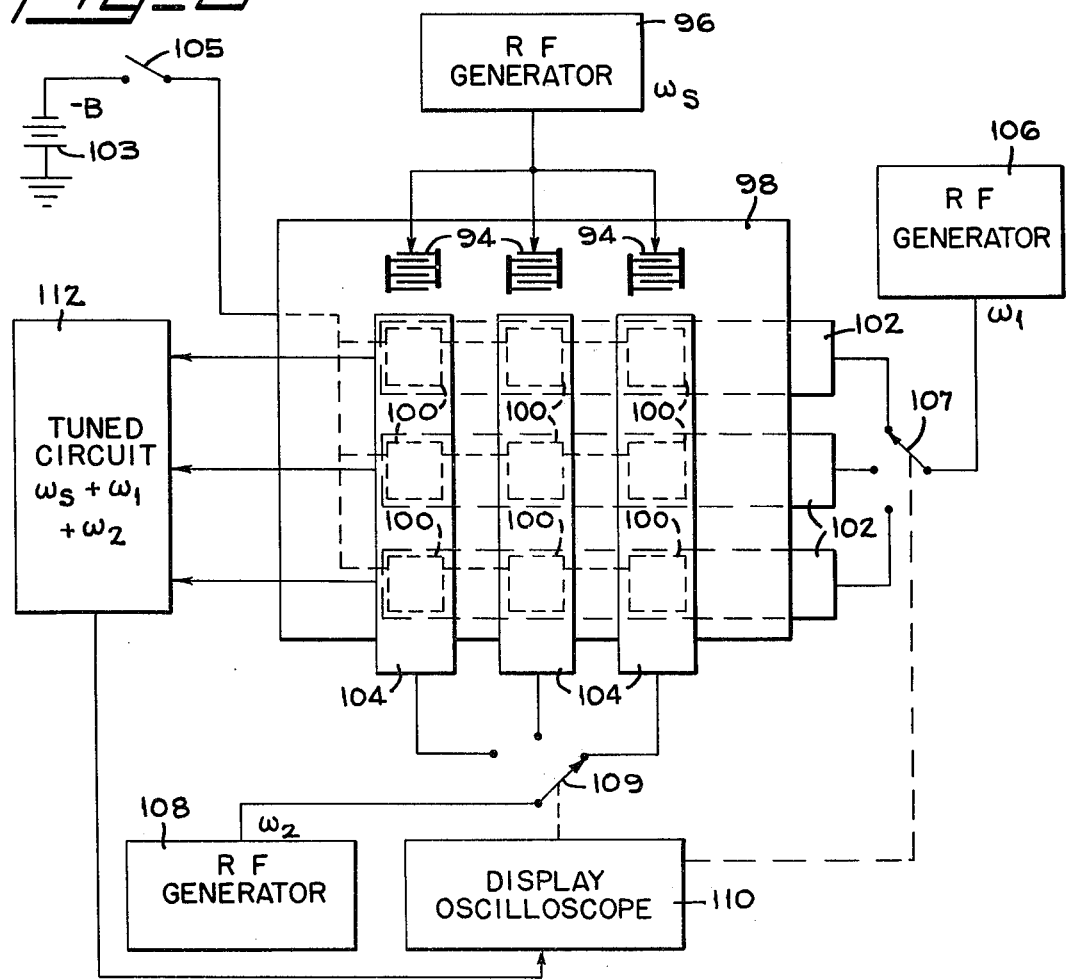

CHARGE STORAGE AND MONITORING APPARATUS UTILIZING ACOUSTIC WAVES

FIELD OF THE INVENTION

The present invention relates generally to charge storage devices and more particularly to acoustic wave apparatus for charge storage on one or more electrodes and for monitoring such stored charge. The invention described and claimed herein was made in the course of a contract with the United States Air Force.

BACKGROUND OF THE INVENTION

The storage of charges on one or more electrodes has obvious applications in both digital and analog computer devices and a relatively large number of devices have been proposed to provide for the charge input to such electrodes and also to provide for monitoring the stored charge at an appropriate time or what is commonly referred to as "readout." By way of example, a recent article in the February, 1974 issue of SCIENTIFIC AMERICAN by Gilbert F. Amelio entitled "Charge-Coupled Devices" explores a relatively recent technique that shows considerable promise not only in computer technology but also for image sensing since the silicon material that provides a base for the individual electrodes is sensitive to visible and near-infrared radiation. While considerable developmental work has already been performed with such charge-coupled devices, as mentioned in the article, they remain subject to certain disadvantages and unsolved problems to which other charge storage techniques have also been subject in one fashion or another.

SUMMARY OF THE PRESENT INVENTION

It is the general objective of the present invention to provide a novel charge storage and monitoring apparatus wherein both the storage and monitoring or readout can be achieved in a very effective fashion through utilization of acoustic waves. Briefly, and in one simple embodiment, such objective is achieved by placing an electrode (Schottky barrier) on a piezoelectric semiconductor so that an electric charge from a suitable input voltage source can be applied to the electrode and stored thereon through the simple expedient of electrically isolating or disconnecting the electrode from the exterior voltage source. Dependent upon the amplitude of the stored charge, the penetration or depth of the depletion layer in the piezoelectric semiconductor is determined. Such depletion layer depth will, in accordance with the present invention, determine the amplitude of an output signal generated by an acoustic wave traversing the piezoelectric semiconductor adjacent the barrier electrode. More particularly, if the amplitude of the acoustic wave is selected and maintained at a constant value, the amplitude of the output signal obtained through suitable detection of the acoustic wave in its traversal of the semiconductor adjacent the electrode will be proportional to the amount of the electric charge on the barrier electrode, thus to provide an acoustic monitoring or readout of the stored charge.

In this simple embodiment of the invention, the charging voltage from a negative direct current source is supplied through suitable switch means to the rectifying barrier electrode centrally positioned on the surface of a piezoelectric semiconductor whereupon when the switch is opened, the charge is isolated on the electrode and is there maintained. The amount of the charge on the barrier electrode determines the depth of the depletion layer in the piezoelectric semiconductor.

In order to read out this information thus ultimately to provide an output signal voltage whose amplitude is directly proportional to the charge on the barrier electrode, pulses of radio frequency energy at the same or different frequencies and at predetermined amplitudes are delivered to a pair of interdigital transducers at opposite ends of the piezoelectric semiconductor so as to generate acoustic waves which undergo nonlinear parametric interaction in the region of the central barrier electrode thus to generate an electric field which is detected by the barrier electrode that is in turn connected to the output circuit. Such interaction is described generally in Kino Patent No. 3,816,753 providing a product of the two acoustic waves so that details of such operation will not be repeated. However, it is to be emphasized that if the amplitude of the acoustic waves is predetermined, the output voltage taken from the barrier electrode will be directly proportionate to the charge thereon. As an obvious consequence, if a charge is placed on the barrier electrode or is left off of such electrode, this can represent a binary digital input which is readily monitored. Furthermore since the output voltage is directly proportional to the amount of the charge, obvious application to analog devices is also observable. Other applications also appear; with certain piezoelectric semiconductors which are sensitive to light or infrared radiation, exposure of the barrier electrode to such radiation will cause a rapid reduction in its charge depending precisely on the intensity of the light or other radiation and an optical image sensor is thus provided.

As an extension of the mentioned first embodiment of the invention, it will be apparent that a plurality of individually charged barrier electrodes can be placed in a linear array between two acoustic input transducers and if the charge on one of such barrier electrodes differs from that of its neighbor, individual outputs from such two electrodes will vary. In turn, a multiplicity of such linear arrays can be arranged on a piezoelectric semiconductor which is light sensitive to provide what may be termed a two-dimensional image panel.

In each case, the readout information can be obtained at any desired time and at a particular location, for example, on the imaging panel by merely timing the introduction of the readout signal. In the specifically mentioned embodiments, such readout signal was in the form of an acoustic wave, but in other embodiments of the invention, acoustic waves may merely flood the entire crystal and an electromagnetic readout signal can be appropriately applied at a selected time to generate the output signal corresponding to the charge voltage at any particular location and time on the piezoelectric semiconductor.

BRIEF DESCRIPTION OF THE DRAWINGS

The stated objective of the invention and the manner in which it is achieved, as summarized hereinabove, will become more readily apparent from the following detailed description of the exemplary embodiments of the invention shown in the accompanying drawings wherein:

FIG. 1 is a diagrammatic perspective view of a charge storage and monitoring device embodying the present invention, FIG. 2 is a graphical illustration representing the relationship of the charge on the FIG. 1 structure for a particular material, gallium arsenide, and the output voltage derived therefrom, FIG. 5 is a further modified embodiment of the invention utilizing but a single acoustic wave but with multiple outputs provided by electrodes in a linear array, and FIG. 6 is a diagrammatic plan view of a two-dimensional imaging panel utilizing the principles of the present invention.

DETAILED DESCRIPTION OF THE EXEMPLARY EMBODIMENTS OF THE INVENTION

Figure 3:
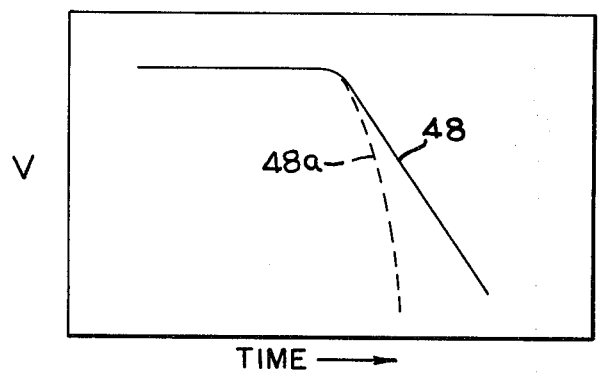
FIG. 3 is a graph illustrating the relationship of the output voltage of the FIG. 1 structure over a period of time when illuminated.

With initial reference to FIG. 1, the electrode 10 to be charged in accordance with the present invention specifically takes the form of a thin film or plate of aluminum or other material which forms a rectifying barrier (Schottky barrier) on the upper n- type layer of gallium arsenide (GaAs) with a carrier concentration of $4 \times 10^{14}$ CM$^{-3}$ and a thickness of approximately 20 microns which is overlaid on an $n^+$ semi-insulating substrate thus to form an epitaxial piezoelectric semiconductor 12 which not only is capable of propagating acoustic waves but is also sensitive to light and other forms of radiation. An additional electrode 14 is placed on the $n+$ layer in the form of an indium-gold ohmic contact enabling application of a negative charging voltage $-B$ between such electrodes 10, 14 from a suitable negative voltage source indicated at 16. Since as will be indicated later, the output radio frequency voltage is also taken from the described electrodes, a radio frequency choke 18 is positioned between the negative charging source 16 and the output circuit and, in turn, a direct current isolating capacitor 20 is placed in the radio frequency output circuit. In addition, a variable shunt capacitor 22 is positioned across the two electrode terminals which enables variation in charge reduction times as will be explained in detail hereinafter.

A simple switch 24 can be utilized to place the negative charge on the upper barrier electrode 10 and thereafter be opened so that such charge will be maintained for a predetermined period of time dependent upon circuit constants and operational functions. The stored charge on the barrier electrode 10 creates a depletion layer in the piezoelectric semiconductor 12 whose depth W is related to the charge amplitude, as will be explained in detail hereinafter.

In order to monitor or read out the stored charge on the barrier electrode 10, radio frequency pulses of predetermined amplitude and like frequency, $\omega$ are delivered from radio frequency generators, 26, 28 to standard interdigital transducers 30, 32 having a finger spacing determined by the operating frequency. Additional details of such interdigital transducers 30, 32 will not be described since they form no part of the present invention having been described in detail in an article "Design of Surface Wave Delay Lines With Interdigital Transducers" IEE Transactions on Microwave Theory and Techniques, Vol. MTT-17, No. 11, November 1969, pages 865-873, in the present instance, these interdigital transducers 30, 32 are deposited on top of thin layers 34, 36 of zinc oxide which is separated by thin films of gold 38, 40 and intermediate layers 42, 44 of silicon dioxide from the epitaxial GaAs crystal 12 previously described. These input transducers 30, 32 are highly efficient and generate acoustic wave pulses that propagate in opposite directions and are timed to interact in the region underneath the barrier electrode 10 which has a length in this direction which is a multiplicity of wavelengths at the operating frequency, $\omega$.

As described in general in the mentioned Kino U.S. Pat. No. 3,816,753 the product of the two acoustic waves will be sensed by the barrier electrode 10 thus to generate the output signal. However, whereas in the Kino surface acoustic wave structures, the product of the strain amplitudes was observed in the present instance, because of the propagation in the GaAs and the presence of the mentioned depletion layer, it is specifically the product of the electric fields $E_1$, $E_2$ resultant from the two acoustic waves which will be detected at the sum frequency of $2\omega$.

More particularly, the output voltage V at the frequency $2\omega$ can be represented by the following equation:

$$V_{2\omega} = \frac{1}{2} \frac{\epsilon (E)^2}{e \, N_d}$$

where:
$\epsilon$ is the dielectric constant;
$e$ is the electronic charge;
$N_d$ is the impurity density; and
E is the electric field in the depletion layer.

In the present instance since an electric field $E_1$ is associated with the first acoustic wave and an electric field $E_2$ is associated with the second field, the equation takes the revised form $$V_{2\omega} = \frac{1}{2} \frac{\epsilon}{e} \frac{(E_1 + E_2)^2}{N_d} \text{ or}$$

$$V_{2\omega} = \frac{1}{2} \frac{\epsilon}{e} \frac{(E_1^2 + 2E_1 E_2 + E_2^2)}{N_d}$$

Since the barrier electrode 10 in the FIG. 1 structure extends over multiple wavelengths, only the $E_1 E_2$ term can be detected since it alone has zero spatial variation along the surface of the piezoelectric semiconductor 12. However, as discussed in the mentioned Kino patent, if the barrier electrode 10 were to take the alternate form of an appropriately designed interdigital transducer two acoustic waves having different frequencies, $\omega_1$ and $\omega_2$, can be detected either at the sum or difference frequency. Furthermore, either the $E_1^2$ or $E_2^2$ terms could be detected at the frequency $2\omega$ and as a consequence, a single acoustic wave could be utilized rather than the two acoustic waves as shown in FIG. 1 to perform the monitoring function.

It is known that the strength of the $E_1$ and $E_2$ fields vary uniquely with the depth $\omega$ of the depletion layer. Consequently, it will be seen that if a given piezoelectric semiconductor 12 is utilized such as the mentioned GaAs and if a constant amplitude of the radio frequency input signals are established, the output voltage V from the device will be determined purely and simply by the charge on the barrier electrode 10 or more particularly, the resultant depth ω of the depletion layer at the time of monitoring.

Specifically for GaAs, the output voltage V is graphically illustrated in FIG. 2 as a function shown by the curve 46 of the depth ω of the depletion layer or what amounts to the same thing, the correlated charging voltage −B. With predetermined constant input acoustic powers, as can be illustrated clearly by reference to the graph, choice of any particular charging voltage −B will precisely determine the possible output voltage V of the FIG. 1 structure and will vary if such charge in turn varies.

With reference to the curve 48 in FIG. 3, a predetermined decay of the charge on the barrier electrode 10 resultant from leakage will occur even in a non-illuminated region so that the output voltage V will drop over a period of several seconds, which decay time can be varied through adjustment of the variable shunt capacitor 22 previously mentioned and can be maintained for a period of several minutes, if desired. On the other hand, if illumination is directed against the barrier electrode 10 from a light source 50 positioned thereabove electron-hole pairs will be generated in the epilayer surrounding the electrode and the holes will move to the electrode and neutralize the stored charge so that a much more abrupt decay in the electrode charge will be experienced as indicated by the dotted curve 48a in FIG. 3.

It will be apparent to those skilled in the art that other piezoelectric semiconductors 12 than the mentioned epitaxial GaAs can be utilized, CdS, InP, InAs, and GaP being examples. Furthermore, the term "piezoelectric semiconductor" is to be broadly construed to include piezoelectric material associated with a semiconductor substrate, for example, a layer of piezoelectric zinc oxide on semiconductive silicon. Additionally transducers other than the specifically described interdigital transducers 30, 32 can be utilized to generate either surface or bulk acoustic waves, and the barrier electrode 10 can either be in the form of a plate or an interdigital or other form of output transducer depending upon the operating characteristics of the device. Furthermore, it will be apparent that either digital or analog inputs can be introduced to the barrier electrode 10 to establish the charge thereon for storage and subsequent monitoring and various charge modifying arrangements in addition to the mentioned light radiation can be introduced to vary the charge on the barrier electrode 10 over a period of time for subsequent readout.

Figure 4:
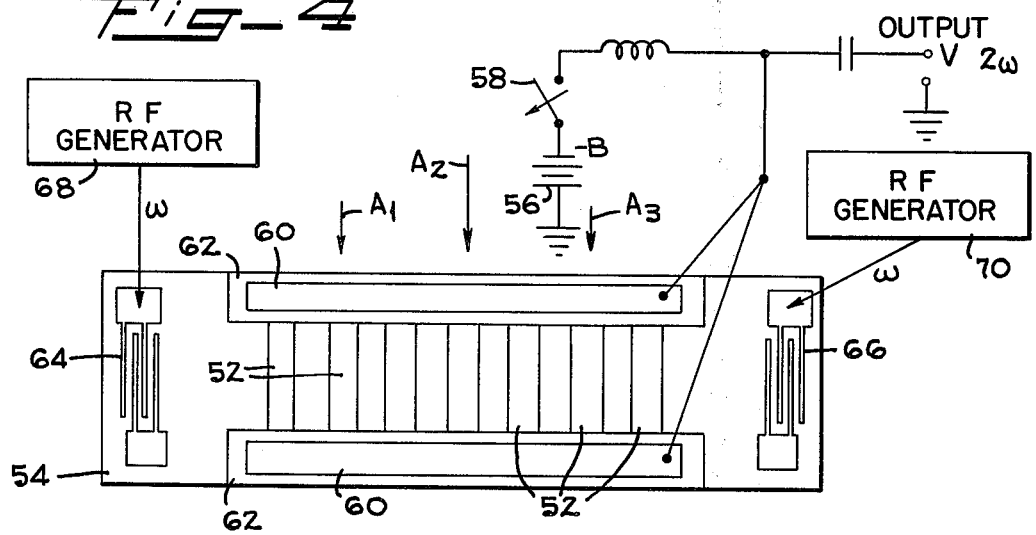
FIG. 4 is a diagrammatic plan view of a modified embodiment of the invention utilizing a plurality of electrodes in a linear array for purposes of light imaging.
Figure 4A:
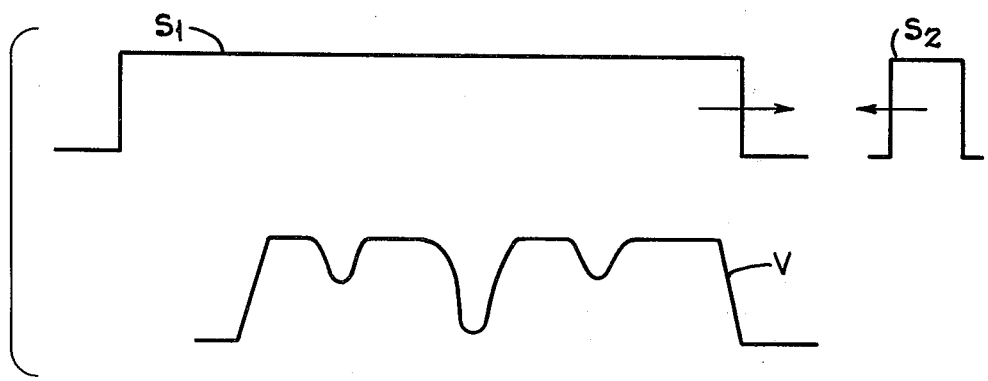
FIG. 4a is a time graph illustrating the input acoustic energy and output voltage of the FIG. 4 structure.

By way of example of a modification which provides a simplified optical image sensor, reference is made to FIG. 4 wherein a plurality of barrier electrodes 52 are positioned in a linear array along a piezoelectric semiconductor 54, each having a linear extent along the direction of acoustic wave propagation of a number of acoustic wavelengths. The negative charging voltage −B from a source 56 is delivered through a switch 58 to a pair of metal strip conductors 60 insulated from the multiplicity of barrier electrodes 52 by insulating layers 62 of silicon dioxide or other material so that a capacitive charging of each of the barrier electrodes to a predetermined level can be achieved. Two interdigital transducers 64, 66 are deposited at opposite ends of the piezoelectric semiconductor 54 so as to generate, upon energization by standard radio frequency pulse generators 68, 70 acoustic waves which traverse the crystal in opposite directions passing in sequence under the multiplicity of barrier electrodes. The acoustic pulse from the transducer 64 on the left as indicated at $S_1$ in FIG. 4a is of sufficient length to encompass all the barrier electrodes 52 at the same time and when a readout is desired a relatively short acoustic pulse $S_2$ is generated in the second transducer 66 to pass in the opposite direction underneath the barrier electrodes 52, thus providing at each a signal product output which is again proportionate to the charge on the individual barrier electrodes, the sequential outputs from the barrier electrodes 52 being detected therein as an output voltage V at the sum of the input frequencies. If for example, each of the generators 68, 70 produce pulses at a frequency ω, the output voltage V again will be at the sum frequency, 2ω.

If light, as indicated by the arrows $A_1$, $A_2$, and $A_3$ and in the amount as indicated by the arrow lengths, is directed against certain barrier electrodes, a rapid charge decay will occur and the output signal V will vary in amplitude as indicated in the lower portion of FIG. 4a, thus clearly generating an output representative of the optical pattern.

It will be apparent that a plurality of the linear arrays of FIG. 4 can be placed side by side on a single piezoelectric semiconductor so that a two-dimensional pattern can also be generated and with appropriate sequencing be displayed on a conventional oscilloscope.

While the described embodiments shown in FIGs. 1 and 4 utilize two acoustic waves for charge monitoring, it will be apparent the readout can be accomplished utilizing but a single acoustic wave, as previously mentioned. By way of example, in FIG. 5 there is illustrated a piezoelectric semiconductor 72 having a plurality of barrier electrodes 74 at appropriately spaced positions along a linear array so as to be traversed by an adjacent acoustic surface wave developed from a radio frequency pulse generator 76 in an aligned interdigital transducer 78 at the left end of the piezoelectric semiconductor at a predetermined frequency $\omega_1$. For example, if the frequency $\omega_1$ is 165MHz, the acoustic wavelength is approximately 16 microns and the width of the barrier electrodes 74 along the piezoelectric semiconductor should be equal to or less than one half wave length or 8 microns and the spacing therebetween should be a substantially equal distance thus to provide for a pickup of the generated acoustic wave. A charging voltage −B is applied to all of the barrier electrodes 74 from a source 80 through a coil 82 connected individually to each barrier electrode by a relatively high value isolating resistor 84 of perhaps $10^5$ ohms and any output generated is delivered through suitable condensers 86 to a common conductor 88 to provide the output voltage V.

Additionally, a radio frequency signal at a frequency $\omega_2$ is constantly applied to the electrodes 74 from a radio frequency generator 92 through a condenser 90. The acoustic wave generated by a pulse of perhaps 0.1 microsecond from the pulse generator 76 mixes with the constantly applied signal in the electrodes 74 to provide the output (readout) at the sum frequency, $\omega_1 + \omega_2$.

Furthermore, it will be apparent that each of the electrodes 74 can be individually and separately charged to provide a multiple charge storage device and application of the radio frequency acoustic wave pulse will then provide individual time-sequenced readouts.

In turn, it will be obvious a plurality of the linear arrays of FIG. 5 could be placed in side by side relation to provide a two-dimensional pattern, and in turn, if light or other radiation is directed against the barrier electrodes, the optical pattern will be represented by the sequential output voltages from the individual electrodes.

A slightly variant form of imaging panel is illustrated in FIG. 6 wherein a plurality of laterally-spaced interdigital transducers 94 energized by a single radio frequency generator 96 are arranged to generate acoustic waves so as to flood constantly the entire area of a piezoelectric semiconductor 98 at a predetermined amplitude and at a frequency $\omega_s$.

A plurality of small barrier electrodes 100 having transverse dimensions less than one half wavelength at the applied acoustic frequency $\omega_s$ and an equivalent spacing therebetween are disposed on the piezoelectric semiconductor 98 in a regular pattern of rows and columns, and are all connected to a negative charging voltage source 103 through a switch 105 in a fashion similar to the other embodiments of the invention. Groups of strip conductors 102, 104 are disposed both vertically and horizontally as shown so as to overlap in regions adjacent the small barrier electrodes 100. The strip conductors 102, 104 are separated from one another and from the barrier electrodes 100 by suitable insulating layers of material such as silicon oxide and radio frequency signals from generators 106, 108 at frequencies $\omega_1$ and $\omega_2$ are applied in a step fashion to the conductors 102, 104 so that a unique output signal is generated at the sum frequency $\omega_1$, $\omega_2$, and $\omega_s$ only when energization of individual strip pairs adjacent an individual barrier electrode is achieved. Obviously, this sequential application of the voltages to the two strip conductor groups can be controlled by switches 107, 109 controlled by the vertical and horizontal sweep voltages of an oscilloscope 110. The output voltage at the sum frequency, $\omega_s+\omega_1+\omega_2$, can be delivered through a tuned circuit 112 for oscilloscope display.

Obviously many further modifications and or alterations can be made in the structures and operational characteristics described hereinabove with respect to several embodiments of the invention and foregoing description accordingly is not to be considered as limiting and the actual scope of the invention is to be indicated only by reference to the appended claims.

What is claimed is:

1. Charge storage and monitoring apparatus utilizing acoustic waves which comprises:
   a piezoelectric semiconductor,
   a barrier electrode associated with said piezoelectric semiconductor and capable of supporting an electric charge,
   means for generating an acoustic wave of selected amplitude in said semiconductor to traverse the same adjacent said barrier electrode, and
   means for detecting the acoustic wave fields during such traversal to provide an output signal proportional to the electric charge on said barrier electrode.

2. Charge storage and monitoring apparatus according to claim 1 wherein:
   said piezoelectric semiconductor constitutes a radiation sensitive material.

3. Charge storage and monitoring apparatus according to claim 1 wherein:
   said piezoelectric semiconductor is in the form of an epitaxial layered structure.

4. Charge storage and monitoring apparatus according to claim 1 wherein:
   said barrier electrode has a dimension in the acoustic wave propagation direction less than one-half the acoustic wavelength.

5. Charge storage and monitoring apparatus according to claim 1 wherein:
   said detecting means includes said barrier electrode.

6. Charge storage and monitoring apparatus according to claim 1 wherein:
   said barrier electrode is in the form of a plurality of segments, each having a dimension in the direction of acoustic wave propagation less than one-half the acoustic wavelength.

7. Charge storage and monitoring apparatus according to claim 1 which comprises:
   a source of charging voltage, and
   switch means connected between said voltage source and said barrier electrode and operable when closed to apply a charge to said electrode and when open to electrically isolate said electrode whereby the charge is stored thereon.

8. Charge storage and monitoring apparatus according to claim 7 which comprises:
   means for changing the charge on said barrier electrode after its isolation.

9. Charge storage and monitoring apparatus according to claim 8 wherein:
   said charge changing means includes a light directed against said semiconductor in the vicinity of said barrier electrode.

10. Charge storage and monitoring apparatus utilizing acoustic waves which comprises:
    a piezoelectric semiconductor,
    a barrier electrode associated with said piezoelectric semiconductor and capable of supporting a selected charge,
    means for generating an acoustic wave in said semiconductor to traverse the same adjacent the barrier electrode, and
    means for generating a signal in said electrode adjacent said semiconductor to provide an output signal proportional to the electric charge on said barrier electrode.

11. Charge storage and monitoring apparatus according to claim 10 wherein:
    said signal generating means includes means for generating a second acoustic wave arranged to traverse said piezoelectric semiconductior adjacent said barrier electrode to interact with the acoustic wave generated by said first acoustic wave generating means.

12. Charge storage and monitoring apparatus according to claim 10 wherein:
    said signal generating means includes means for generating a signal in said barrier electrode to interact with the signal developed in said barrier electrode resultant from traversal of the acoustic wave through said semiconductor adjacent thereto.

13. Charge storage and monitoring apparatus according to claim 10 wherein:
    said signal generating means includes a pair of strip conductors intersecting in adjacent relation to said barrier electrode, and means for introducing electromagnetic signals to each of said strip conductors.

14. Charge storage and monitoring apparatus according to claim 10 which comprises:
a plurality of additional barrier electrodes aligned in a linear array on said piezoelectric semiconductor along the path traversed by the acoustic wave.

15. Charge storage and monitoring apparatus according to claim 14 which comprises:
a plurality of additional linear arrays of aligned barrier electrodes, and
means for generating additional acoustic waves to traverse said piezoelectric semiconductor adjacent all of said linear arrays of barrier electrodes.

16. Charge storage and monitoring apparatus utilizing acoustic waves which comprises:
a piezoelectric semiconductor,
a plurality of barrier electrodes arranged in regular rows and columns on said semiconductor,
a source of charging voltage,
switch means connected between said charging voltage source and said electrodes enabling application of a charge to each of said electrodes,
means for generating an acoustic wave in said piezoelectric semiconductor to traverse the same adjacent said barrier electrodes, and
means for generating signals uniquely associated with individual electrodes to provide an output signal related to the charging voltage thereon.

17. Charge storage and monitoring apparatus according to claim 16 wherein:
said signal generating means includes means for applying a radio frequency signal to each of said barrier electrodes in individual sequence.

18. Charge storage and monitoring apparatus according to claim 16 wherein:
said signal generating means includes groups of strip conductors overlapping said rows and columns of barrier electrodes to be capacitively coupled thereof, and
means for applying separate radio frequency signals in time sequence to each of said row overlapping and column overlapping strip conductors.

19. Charge storage and monitoring apparatus according to claim 18 which comprises:
a tuned circuit connected to said strip conductors and tuned to the sum or difference frequency of said acoustic wave and applied radio frequency signals on said strip conductors.

20. Charge storage and monitoring apparatus according to claim 19 which comprises:
a display oscilloscope,
means for controlling the timed sequence of said radio frequency signals by the sweep voltage outputs of said oscilloscope, and
means for connecting said tuned circuit to said oscilloscope to display the combined signal output.

21. Charge storage and monitoring apparatus according to claim 20 wherein:
said piezoelectric semiconductor is sensitive to radiation wherefore light or other radiation directed thereagainst will effect a decay of the charge on each barrier electrode in proportion to the intensity of the radiation at the location of each barrier electrode.

\* \* \* \* \*